United States Patent [19]

Suzuki

[11] 4,401,954

[45] Aug. 30, 1983

[54] POWER AMPLIFIER

[75] Inventor: Tadao Suzuki, Tokyo, Japan

[73] Assignee: Sony Corporation, Tokyo, Japan

[21] Appl. No.: 292,507

[22] Filed: Aug. 13, 1981

[30] Foreign Application Priority Data

Aug. 14, 1980 [JP] Japan .................................. 55-112015

[51] Int. Cl.³ .............................................. H03F 3/26
[52] U.S. Cl. ..................................... 330/297; 330/268
[58] Field of Search ......................... 330/268, 297, 267

[56] References Cited

U.S. PATENT DOCUMENTS 4,087,759  5/1978  Iwamatsu ........................... 330/297

Primary Examiner—James B. Mullins
Assistant Examiner—Gene Wan
Attorney, Agent, or Firm—Hill, Van Santen, Steadman & Simpson

[57] ABSTRACT

A power amplifier includes first and second push-pull amplifiers, each of which is supplied with a different DC supply voltage to each other. First and second switching transistors are provided to change-over a drive signal to said first and second push-pull amplifiers in accordance with the output voltage at either one of said push-pull amplifiers.

9 Claims, 6 Drawing Figures

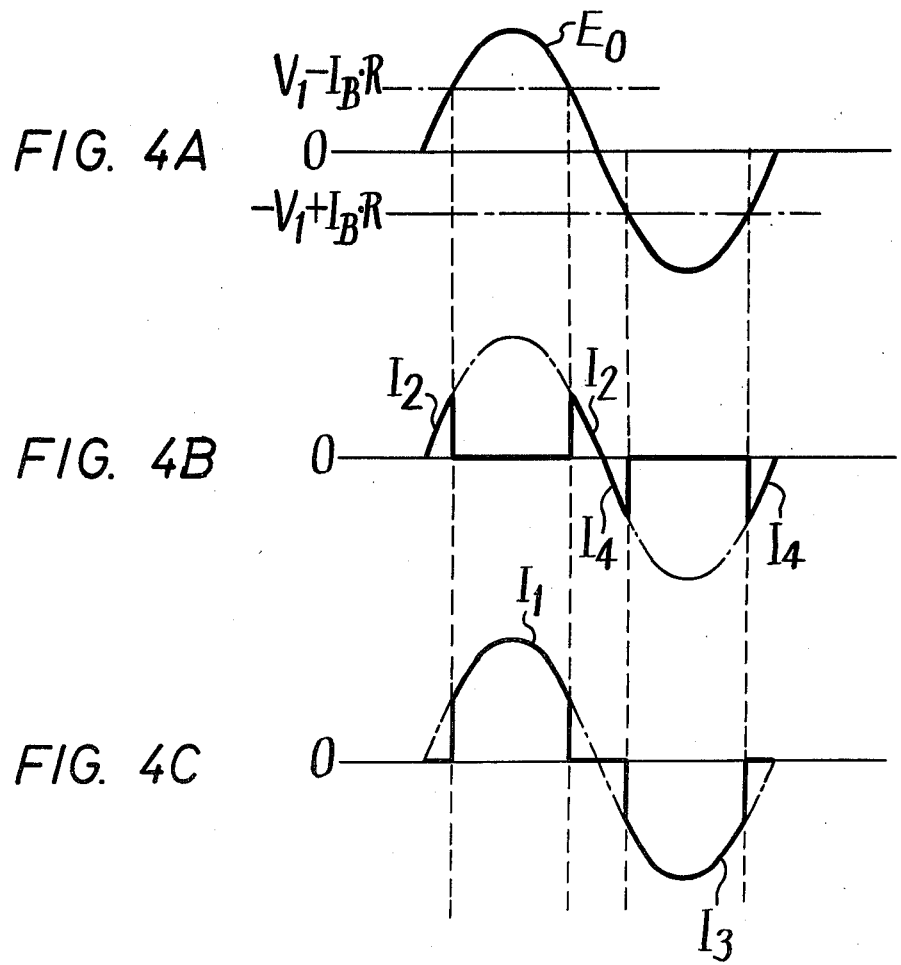

POWER AMPLIFIER

BACKGROUND OF THE INVENTION

1. Field of the Invention

The present invention relates generally to a power amplifier, and is directed more particularly to a power amplifier in which a power supply voltage is changed over.

2. Description of the Prior Art

In the art, there has been proposed such a power amplifier in which the power supply voltage is changed over in response to the amplitude of an input signal or output signal. This kind of the power amplifier has been practically used in various fields since the power amplifier is less in heat generation, high in efficiency and economical. However, up to now there has been proposed no such power amplifier high in efficiency in which an output current flowing through a load is parallely changed over in response to the amplitude of an output signal. That is, in a conventional high efficiency amplifier, output transistors are connected in series to a power supply source so that an excess current flows through all of the output transistors when an input signal is large. Therefore, it is necessary to employ transistors which will withstand a large current as all the output transistors, which results high in cost.

OBJECTS AND SUMMARY OF THE INVENTION

Accordingly, an object of the present invention is to provide a novel power amplifier free from the defects encountered in the prior art.

Another object of the invention is to provide a high efficiency power amplifier in which the current fed to a load is parallely changed over in response to the level of an output voltage.

In accordance with one example of the present invention, there is provided a power amplifier which comprises:

(a) first and second positive DC voltage terminals, the DC voltage at the first positive DC voltage terminal being lower than that at the second positive DC voltage terminal;

(b) first and second negative DC voltage terminals, the DC voltage at the first negative DC voltage terminal being lower than that at the second negative DC voltage terminal;

(c) signal input circuits producing a pair of input signals with opposite phase relation at first and second output terminals;

(d) first and second output transistors having input electrodes connected to the first and second output terminals of the signal input means, respectively, the main current paths of which are connected in series between the first positive and negative DC voltage terminals, the connection point of the first and second output transistors being a signal output terminal to be connected with a load;

(e) third and fourth output transistors each having an input electrode, the main current paths of which are connected in series between the second positive and negative DC voltage terminals, the connection point of the third and fourth output transistors being connected to the signal output terminal;

(f) a first switching transistor having a control electrode connected to the signal output terminal, the main current path of which is connected between the input electrode of the third transistor and the first output terminal of the signal input means; and (g) a second switching transistor having a control electrode connected to the signal output terminal, the main current path of which is connected between the input electrode of the fourth transistor and the second output terminal of the signal input means.

The other objects, features and advantages of the present invention will become apparent from the following description taken in conjunction with the accompanying drawings through which the like references designate the same elements and parts.

BRIEF DESCRIPTION OF THE DRAWINGS

FIGS. 4A to 4C are respectively waveform diagrams used to explain the operation of the embodiment of the invention shown in FIG. 3.

DESCRIPTION OF THE PREFERRED EMBODIMENT

Figure 1:
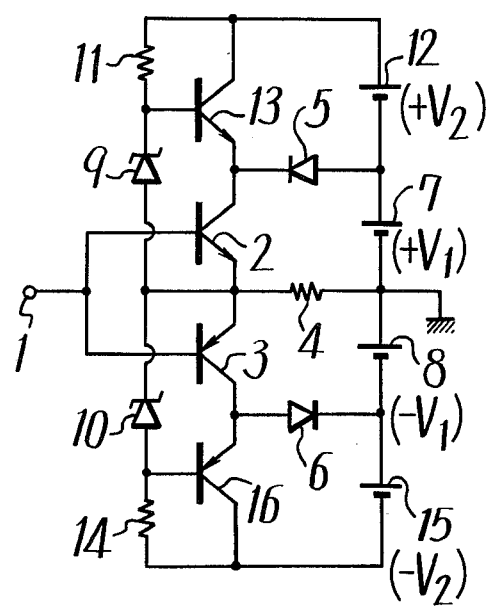
FIG. 1 is a circuit connection diagram showing an example of a prior art power amplifier.

Before describing the present invention, an example of a prior art output transformerless output power amplifier, which is to make the efficiency high, will be first explained with reference to FIG. 1. In the figure, reference numeral 1 designates an input terminal to which an audio signal is applied. The audio signal fed to the audio signal input terminal 1 is applied to the bases of an NPN-type transistor 2 and a PNP-type transistor 3 which form a push-pull amplifier circuit. The emitters of the transistors 2 and 3 are connected together and then grounded through a load resistor such as a speaker 4. The collector of the transistor 2 is connected to the cathode of a diode 5 which has the anode connected to the positive electrode of a DC voltage source 7 whose negative electrode is grounded. The collector of the transistor 3 is connected to the anode of a diode 6 which has the cathode connected to the negative electrode of a DC voltage source 8 whose positive electrode is grounded. In this case, the voltage values of the DC voltage sources 7 and 8 are selected equal, for example, $V_1$. The connection point between the emitters of the transistors 2 and 3 is connected to the anode of a Zener diode 9 for a constant voltage and also to the cathode of a Zener diode 10 for a constant voltage. The cathode of the Zener diode 9 is connected through a resistor 11 to the positive electrode of a DC voltage source 12 whose negative electrode is connected to the positive electrode of the DC voltage source 7. The connection point between the Zener diode 9 and the resistor 11 is connected to the base of an NPN-type transistor 13 which has the collector connected to the positive electrode of the DC voltage source 12 and the emitter connected to the collector of the transistor 2. While, the anode of the Zener diode 10 is connected through a resistor 14 to the negative electrode of a DC voltage source 15 which has the positive electrode connected to the negative electrode of the DC voltage source 8. The connection point between the Zener diode 10 and the resistor 14 is connected to the base of a PNP-type transistor 16 which has the collector connected to the negative electrode of the DC voltage source 15 and the emitter connected to the collector of the transistor 3. In this case, the voltage values of the DC voltage sources 12 and 15 are selected equal, such as $V_2$, and the Zener voltages of the respective Zener diodes 9 and 10 are taken as $V_Z$.

With the circuit of FIG. 1, within the range determined by the following condition $$V_1 - V_Z > E_0$$

where $E_0$ is the voltage value of the output signal across the load resistor 4, the transistors 13 and 16 are both cut off and hence the transistors 2 and 3 are respectively operated by the DC voltage sources 7 and 8 with the voltage value of $V_1$ to form a push-pull amplifier circuit. While, within the range determined by the following condition $$E_0 > V_1 - V_Z$$

the transistors 13 and 16 are both operated so that the transistors 13, 2, 3 and 16 are all operated by the sum voltage $\pm(V_1 + V_2)$ of the DC voltage sources 7, 8 and 12, 15 to form a push-pull amplifier circuit.

Figure 2:
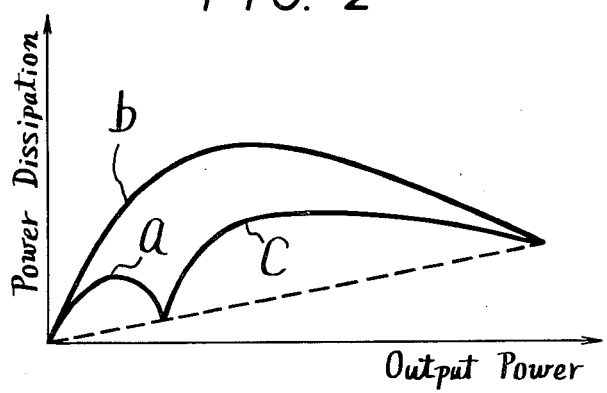
FIG. 2 is a graph used to explain the present invention.

In general, a push-pull amplifier circuit (B-class amplifier circuit) operated with the power source voltage $\pm V_1$ has the output power versus power dissipation characteristic as indicated by a curve a in the graph of FIG. 2, and a push-pull amplifier circuit operated with the power source voltage $\pm(V_1 + V_2)$ has the output power versus power dissipation characteristic as indicated by a curve b in the graph of FIG. 2.

With the prior art circuit of FIG. 1, when the output signal is small of $E_0 < V_1 - V_Z$, it serves as the push-pull amplifier circuit with the power source voltage of $\pm V_1$. Therefore, the circuit of FIG. 1 can reduce the power consumption as compared with the push-pull amplifier circuit where its power source voltage is always $\pm(V_1 + V_2)$. In the circuit of FIG. 1, however, upon a large positive input signal the transistors 2 and 13 are connected in series between the DC voltage source 12 and the load resistor 4, so that the transistors 2 and 13 each must be made of a transistor withstanding for a large power. Similarly, upon a large negative input signal the transistors 3 and 16 are connected in series between the DC voltage source 15 and the load resistor 4, so that the transistors 3 and 16 each must be made of a transistor withstanding for a large power.

Figure 3:
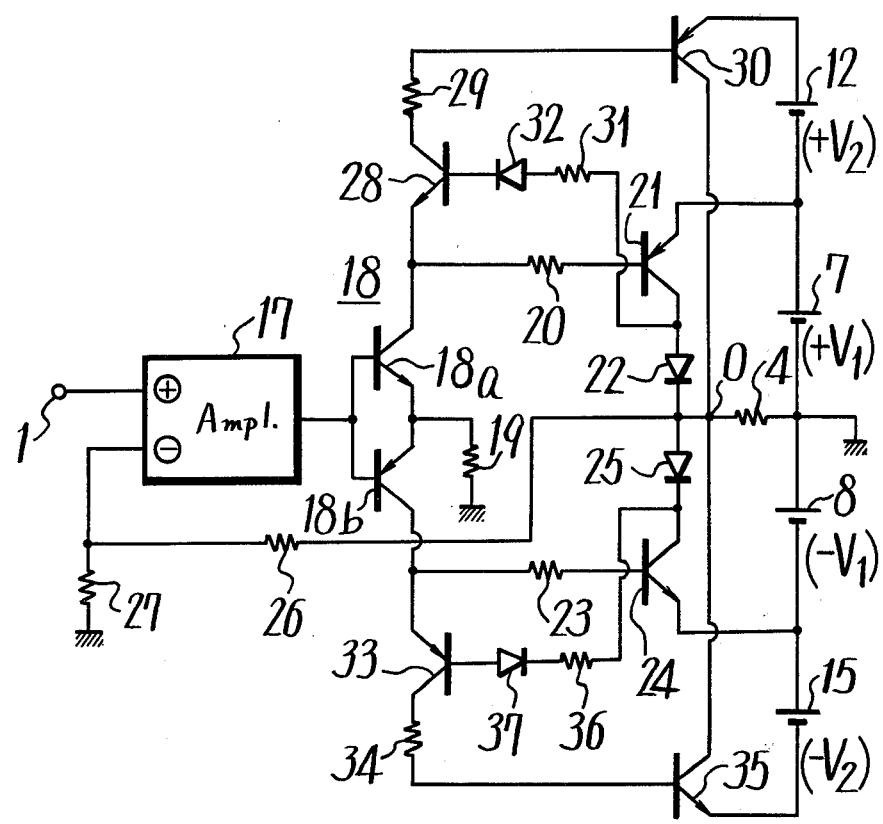
FIG. 3 is a circuit connection diagram showing an example of the power amplifier according to the present invention.

Turning to FIG. 3, an example of the power amplifier according to the present invention will be described, which is free of the above defects encountered in the prior art. In FIG. 3, the parts corresponding to those used in FIG. 1 are marked with the same references and their detailed description will be omitted.

In the embodiment of the present invention shown in FIG. 3, the audio signal applied to the audio signal input terminal 1 is supplied to a positive input terminal ⊕ of a differential amplifier circuit 17 which will form a drive stage. The output signal therefrom is fed to the bases of an NPN-type and PNP-type transistors 18a and 18b, which will form a phase inverter circuit 18 and which have the emitters grounded together through a resistor 19. The collector of the transistor 18a is connected through a resistor 20 to the base of a PNP-type transistor 21 which will form an emitter-grounded amplifier. The emitter of the transistor 21 is connected to the positive electrode of the DC voltage source 7 whose negative electrode is grounded. The transistor 21 has the collector grounded through a series connection of a reverse current blocking or preventing diode 22, which will be descirbed later, and a load resistor 4. The collector of the transistor 18b is connected through a resistor 23 to the base of an NPN-type transistor 24 forming an emitter-grounded amplifier. The transistor 24 has the emitter connected to the negative electrode of the DC voltage source 8, whose positive electrode is grounded and the collector connected to the connection point (output terminal 0) between the diode 22 and the load resistor 4 through a reverse current blocking or preventing diode 25 which will be described later. That is, both the diodes 22 and 25 serve to prevent an output current appearing at the output terminal 0 from being flowed to the bases of transistors 28 and 33 which will be described later. In this example, the transistors 21 and 24 construct a push-pull amplifier circuit. The connection point between the diodes 22 and 25 is connected to the negative input terminal ⊖ of the differential amplifier 17 through a resistor 26 forming the negative feedback circuit. The negative input terminal ⊖ of the differential amplifier 17 is grounded through a resistor 27. The collector of the transistor 18a is connected to the emitter of the NPN-type transistor 28 which serves as a drive current change-over circuit which transistor 28 has the collector connected through a resistor 29 to the base of a PNP-type transistor 30 forming an emitter-grounded amplifier. The transistor 30 has the emitter connected to the positive electrode of the DC voltage source 12, whose negative electrode is connected to the positive electrode of the DC voltage source 7, and the collector connected to the output terminal 0. The collector of the transistor 21 is connected through a resistor 31 to the anode of a diode 32 so as to apparently increase the break-down voltage $BV_{EBO}$ between the emitter and base of the transistor 28 and the cathode of the diode 32 is connected to the base of the transistor 28.

Further, the collector of the transistor 18b is connected to the emitter of the PNP-type transistor 33 forming the drive current change-over circuit, while the collector of the transistor 33 is connected through a resistor 34 to the base of an NPN-type transistor 35 forming an emitter-grounded amplifier which has the emitter connected to the negative electrode of the DC voltage source 15 whose positive electrode is connected to the negative electrode of the DC voltage source 8. The collector of the transistor 35 is connected to the output terminal 0. In this case, the transistors 30 and 35 form a push-pull amplifier circuit. The collector of the transistor 24 is connected through a resistor 36 to the cathode of a diode 37 which operates similar to the diode 32 and has the anode connected to the base of the transistor 33.

In this case, of it is assumed that the base-emitter voltages of the respective transistors 21, 24, 28 and 33 are taken as equal to $V_{BE}$, the voltage drope of te the respective diodes 22, 25, 32 and 37 are taken as $V_f$, the base currents of the respective transistors 21 and 24 as $I_B$, and the resistance values of both the resistors 20 and 23 as R, the transistors 28 and 33 become conductive when the level of the output voltage $E_0$ at the output terminal 0 satisfies the following relation.

In case of the positive half cycle:

$$E_0 > V_1 - V_{BE}(\text{transistor } 21) - I_B \cdot R - V_f(\text{diode } 22) +$$
$$V_f(\text{diode } 32) + V_{BE}(\text{transistor } 28) = V_1 - I_B \cdot R$$

In case of the negative half cycle:

$$-E_0 < -V_1 + I_B \cdot R$$

Accordingly, when $E_0 > V_1 - I_B \cdot R$ in the positive half cycle and $-E_0 < -V_1 + I_B \cdot R$ in the negative half cycle are satisfied, the transistors 28 and 33 turn ON to supply the drive signal to the bases of the respective transistors 30 and 35. At this time, since the collector potentials of the respective transistors 21 and 24 become higher than their emitter potentials, these transistors 21 and 24 become non-conductive. In this case, since the voltage drop $I_B \cdot R$ across the resistors 20 and 23 becomes large when resistance valve $R_L$ of the load resistor 4 is small, the transistors 28 and 33 are driven earlier, while when the resistance value $R_L$ is large, the transistors 28 and 33 are driven late. A constant voltage element (for example, Zener diode) is employed as each of the resistors 20 and 23, the driving of the transistors 28 and 33 becomes constant regardless of the resistance value $R_L$.

When the output voltage $E_0$ across the load resistor 4 or at the output terminal 0 is shown in FIG. 4A, its positive half cycle will be explained.

When the following condition is satisfied, $$E_0 < V_1 - I_B \cdot R$$

the transistor 28 is non-conductive and at this time a relatively small current $I_2$ shown in FIG. 4B flows through the transistor 21.

While, when the following relation is satisfied, $$E_0 \geq V_1 - I_B \cdot R$$

the transistor 28 turns ON and the drive signal is fed to the base of the transistor 30. Thus, a current $I_1$ shown in FIG. 4C flows through the transistor 30.

Now, the negative half cycle of the output voltage $E_0$ will be explained.

When the following condition is satisfied, $$E_0 > -V_1 + I_B \cdot R$$

the transistor 33 is in OFF-state and at this time a relatively small current $I_4$ shown in FIG. 4B flows through the transistor 24.

While, when the following relation is satisfied, $$-E_0 \leq -V_1 + I_B \cdot R$$

the transistor 33 turns ON and the drive current is fed to the base of the transistor 35. Hence, a current $I_3$ shown in FIG. 4C flows through the transistor 35.

According to the embodiment of the invention shown in FIG. 3, the audio signal applied to the input terminal 1 is supplied through the differential amplifier circuit 17 and the phase inverter circuit 18 to the bases of the respective transistors 21 and 24 and also to the emitters of the respective transistors 28 and 33. When the level of the output voltage $E_0$ across the load resistor 4 is smaller than a predetermined value, the push-pull amplifier circuit constructed of the transistors 21 and 24 will operate with the DC voltage sources 7 and 8 of the voltage value $\pm V_1$ as its power source. While when the level of the output voltage $E_0$ becomes larger than the predetermined level, the push-pull amplifier circuit composed of the transistors 30 and 35 will operate with the sum voltage $\pm(V_1 + V_2)$ of the DC voltage sources 7 and 8 being of the voltage value $\pm V_1$ and the DC voltage sources 12 and 15 being of the voltage value $\pm V_2$ as its power source.

As set forth above, the power amplifier of the present invention operates as the push-pull amplifier circuit with the DC voltage sources 7 and 8 of $\pm V_1$ as its voltage source when the level of the output voltage $E_0$ is lower than the predetermined value, so that the dissipation or loss of the output amplifier circuit becomes relatively small as indicated by a curve a in the graph of FIG. 2 which shows the output power versus power dissipation characteristic. While, when the level of the output voltage $E_0$ is higher than the predetermined value, the power amplifier of the invention operates as the push-pull amplifier circuit composed of the transistors 30 and 35 with the sum voltage $\pm(V_1 + V_2)$ of the DC voltage sources 7, 8 and those 12, 15 as its voltage source. Thus, at this time the output power versus power dissipation characteristic of the output amplifier circuit becomes as shown in the graph of FIG. 2 by a curve c which means that the power loss is less than that by the curve b.

Further, according to the invention, since the relatively small currents $I_2$ and $I_4$ flow through the transistors 21 and 24, respectively, a transistor withstanding a relatively small current may be used as the transistors 21 and 24. Thus, the power amplifier of the invention is higher than that shown in FIG. 1 in efficiency.

Further, through not shown, if a capacitor is connected between the collector and base of each of the transistors 28 and 33 in the embodiment of the invention shown in FIG. 3 to set the time constant of the drive current ON/OFF circuit and thereby setting the restoring time, the change-over distortion for a high frequency signal can be reduced.

The above description is given on a single preferred embodiment of the invention, but it will be apparent that many modifications and variations could be effected by one skilled in the art without departing from the spirits of scope of the novel concepts of the invention, so that the scope of the invention should be determined by the appended claims only.

I claim as my invention:

1. A power amplifier comprising:
   (a) first and second positive DC voltage terminals, the DC voltage at said first positive DC voltage terminal being lower than that at said second positive DC voltage terminal;
   (b) first and second negative DC voltage terminals, the DC voltage at said first negative DC voltage terminal being lower than that at said second negative DC voltage terminal;
   (c) signal input means producing a pair of input signals with opposite phase relation at first and second output terminals;
   (d) first and second output transistors having input electrodes connected to the first and second output terminals of said signal input means, respectively, the main current paths of which are connected in series between said first positive and negative DC voltage terminals, the connection point of said first and second output transistors being a signal output terminal to be connected with a load;
   (e) third and fourth output transistors each having an input electrode, the main current paths of which are connected in series between said second positive and negative DC voltage terminals, the connection point of said third and fourth output transistors being connected to said signal output terminal;

(f) a first switching transistor having a control electrode connected to said signal output terminal, the main current path of which is connected between the input electrode of said third transistor and the first output terminal of said signal input means; and (g) a second switching transistor having a control electrode connected to said signal output terminal, the main current path of which is connected between the input electrode of said fourth transistor and the second output terminal of said signal input means.

2. A power amplifier according to claim 1, in which each of said first and second output transistors has base, emitter and collector, the base being said input electrode, the emitter-collector circuit forming said main current path and each of said first and second output transistors being connected in a common emitter circuit.

3. A power amplifier according to claim 1, in which each of said third and fourth output transistors has base, emitter and collector, the base being said input electrode, the emitter-collector circuit forming said main current path, and each of said third and fourth output transistors being connected in a common emitter circuit.

4. A power amplifier according to claim 2, further including a first diode connected between the collector of said first output transistor and said signal output terminal, the connection point of said first diode with the collector of said first output transistor being connected to the control electrode of said first switching transistor, said first diode preventing an output current at said signal output terminal from flowing into the control electrode of said first switching transistor.

5. A power amplifier according to claim 4, further including a second diode connected between the collector of said second output transistor and said signal output terminal, the connection point of said second diode with the collector of said second output transistor being connected to the control electrode of said second switching transistor, said second diode preventing said output current at said signal output terminal from flowing into control electrode of said second switching transistor.

6. A power amplifier according to claim 5, further including a third diode connected between the connection point of said first diode with the collector of said first output transistor and the base of said first switching transistor, the polarity of said third diode being forward direction with respect to the base-emitter junction of said first switching transistor.

7. A power amplifier according to claim 6, further including a fourth diode connected between the connection point of said second diode with the collector of said second output transistor and the base of said second switching transistor, the polarity of said fourth diode being forward direction with respect to the base-emitter junction of said second switching transistor.

8. A power amplifier according to claim 1, in which said signal input means comprises a differential amplifier as a drive stage and a phase inverting stage connected to the output of said differential amplifier, and having said first and second output terminals producing a pair of input signals.

9. A power amplifier according to claim 8, in which said phase inverting stage comprises further transistors connected in push-pull relation.

* * * * *